United States Patent [19]
Trott et al.

[11] Patent Number: 6,139,972
[45] Date of Patent: Oct. 31, 2000

[54] SOLDER PASTE CONTAINMENT DEVICE

[75] Inventors: Gary R Trott, San Mateo; Geary L. Chew, Foster City; Matthew K. Schwiebert, Santa Rosa, all of Calif.

[73] Assignee: Agilent Technologies Inc., Palo Alto, Calif.

[21] Appl. No.: 09/179,245

[22] Filed: Oct. 26, 1998

[51] Int. Cl.[7] .............................. B32B 15/08; B23K 1/00
[52] U.S. Cl. ................... 428/458; 428/446; 428/473.5; 228/41; 228/56.3
[58] Field of Search ................................. 428/195, 209, 428/210, 446, 473.5, 457, 702, 901, 458; 257/737, 738; 228/33, 41, 56.3

[56] References Cited

U.S. PATENT DOCUMENTS

| | | | |
|---|---|---|---|
| 5,162,257 | 11/1992 | Yung | 437/183 |
| 5,217,597 | 6/1993 | Moore | 205/123 |
| 5,307,983 | 5/1994 | Dudderar et al. | 228/180.22 |
| 5,400,950 | 3/1995 | Myers | 228/180.22 |
| 5,447,264 | 9/1995 | Koopman et al. | 28/563 |
| 5,539,153 | 7/1996 | Schwiebert et al. | 174/260 |
| 5,586,715 | 12/1996 | Schwiebert et al. | 21/60 |
| 5,643,831 | 7/1997 | Ochiai et al. | 21/283 |
| 5,672,542 | 9/1997 | Schwiebert et al. | 437/183 |
| 5,762,259 | 6/1998 | Hubacher et al. | 228/180.22 |
| 5,775,569 | 7/1998 | Berger et al. | 228/254 |
| 5,880,017 | 3/1999 | Schwiebert et al. | 438/613 |
| 5,889,326 | 3/1999 | Tanaka | 23/48 |
| 6,008,071 | 12/1999 | Karasawa et al. | 438/115 |

FOREIGN PATENT DOCUMENTS 401003495A   1/1989   Japan .

*Primary Examiner*—Deborah Jones
*Assistant Examiner*—Stephen Stein

[57] ABSTRACT

The invention provides an improved donor substrate for the formation and transfer of solder bumps useful in IC packaging and related interconnect applications. The donor substrate is improved by shaping the solder paste containment region (cavity) so that during reflow, the solder bump is urged to protrude significantly above the surface of the donor substrate, enabling proximity transfer of the solder bump to a receiving substrate.

14 Claims, 5 Drawing Sheets

SOLDER PASTE CONTAINMENT DEVICE

FIELD OF INVENTION

This invention relates to integrated circuit packaging, and more particularly to solder bumps as interconnections for integrated circuits and packages. Most particularly, this invention relates to solder bump deposition useful in flip-chip and surface mount technology.

BACKGROUND

Solder bumps provide electrical and/or mechanical connection between two or more substrates. Contained paste deposition is a method of depositing solder bumps in which solder paste occupies a containment region or cavity in a so-called containment structure, and where the solder paste containment assembly remains substantially unmoved through the reflow portion of the solder bump formation process. The process solder bump formation via contained paste deposition further includes dispensing or depositing solder paste into deposition regions (hereinafter also referred to as cavities) in a donor substrate. The donor substrate with the solder paste-filled cavities, may be flipped over, and is aligned and in contact with or in close proximity to a receiving substrate with patterns of solderable metallization corresponding to the cavities. The entire solder paste containment assembly, including the donor substrate, receiving substrate and solder paste is heated in a controlled manner, or reflowed. During the reflow stage of the process, the solder powder in the solder paste melts and, within each containment region on the donor substrate, coalesces into a single solder ball or bump per cavity. As the molten solder ball or bump coalesces, it pushes against the bottom and sides of the paste containment cavity until it reaches an equilibrium position.

Hard masks, typically made of silicon, ceramic or metal, are the most promising donor substrates because of their versatility and ability to withstand high reflow temperatures. Photoimageable polymer masks, with few exceptions, commence to burn around 250° C. and are useful only for deposition of low temperature solders. Moreover, polymer film processing equipment is not a common fixture in semiconductor fabrication facilities. Finally, photoimageable polymer masks must be made thin (no more than about 0.5 mm thick) in order to be properly exposed and developed.

Hard masks can damage the surface of the substrate being bumped (the receiving substrate) especially if the receiving substrate is a semiconductor wafer or an integrated circuit (IC). Mechanical damage to the receiving substrate surface can occur any time that the hard mask (donor substrate) makes direct contact with the surface of the receiving substrate.

A solution to the problem of mechanical damage to the receiving substrate is a paste containment apparatus that does not require direct contact between the donor substrate and the surface of the receiving substrate. The donor substrate, typically a hard mask with paste containment cavities on its surface, is aligned face-to-face with and positioned in close proximity to the receiving substrate. One challenge with this approach is transferring the solder bumps across the gap between the donor substrate and the receiving substrate. Moreover, it is necessary that a sufficient solder volume have been deposited and that alignment between the two substrates be maintained.

Key factors in determining volume of the solder bump are the volumetric metal loading of the solder paste (limited by the random close packing of spherical solder particles), and the volume of the paste containment region or cavity. The volume of a solder bump formed by contained paste deposition tends to be no more than about half of the volume of the paste containment cavity in which the solder bump is formed. During reflow, a solder bump must protrude out of the containment cavity so that the bump reaches across or bridges the gap and makes contact with solderable metallization on the receiving substrate. If the solder bump, while molten, does not make contact with solderable metallization on the receiving substrate, it will not transfer but rather remain in the cavity, thereby resulting in a defect on the receiving substrate. Deep paste containment cavities may provide adequate solder volume, but may not force the solder bump to protrude out of the cavity. Shallow paste containment cavities may force the bump to protrude, but may not provide adequate solder volume. Large, shallow cavities also may permit the solder bump to move around in the cavity, possibly out of alignment with the solderable metallization on the receiving substrate, such misalignment resulting in defects on the receiving substrate.

What is needed is a solder paste containment apparatus that provides that the reflowed solder bump protrude above the surface plane of the donor substrate so as to enable proximity transfer of the solder bumps from a donor to a receiving substrate. What is further needed is a solder paste containment apparatus that provides for deposition of adequate solder paste volume on the donor substrate, and, in turn, adequate solder bump volume resulting therefrom. Also needed is a solder paste containment apparatus that provides for alignment between the donor and receiving substrate such that transfer of the solder bumps from the donor to the receiving substrate is facilitated.

BRIEF SUMMARY OF THE INVENTION

The invention provides an improved solder paste containment apparatus that enables proximity (non-contact) bumping of a receiving substrate by urging molten solder bumps to, during reflow, protrude a substantial distance above the surface plane of the donor substrate. Further provided is a solder paste containment apparatus that provides for deposition of adequate solder paste volume on the donor substrate, and, in turn, adequate solder bump volume resulting therefrom. The invention also provides a contained paste deposition apparatus that maintains alignment between the donor and receiving substrate such that transfer of the solder bumps from the donor to the receiving substrate is facilitated.

The invention provides a fractal-like containment cavity wherein the cavity shape promotes protrusion of the solder bump out of the cavity thereby enabling transfer of the solder bump to a receiving substrate with little or no contact between the donor substrate and the receiving substrate. Moreover, the invention provides for solder bumps of increased volume, producing larger solder bumps at a given bump pitch than otherwise produceable.

The focus of this invention is the solder paste containment apparatus, and in particular, the donor substrate and the configuration of the solder paste deposition regions or paste containment cavities within which the solder bump are formed and from which the solder bumps are transferred. Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 3, 3A and 3B inclusive, illustrates a donor substrate as in FIG. 2, bearing a solder containment cavity of a predetermined shape and a cross section of a solder bump formed within said solder containment cavity in accordance with the invention taught herein.

FIGS. 4, 4A through 4E inclusive, illustrates the preferred and some alternative embodiments of the improved donor substrate according to the invention taught herein.

FIGS. 5, 5A and 5B inclusive, illustrates an alternate embodiment of the invention taught herein.

DETAILED DESCRIPTION OF THE DRAWINGS

Figure 1:
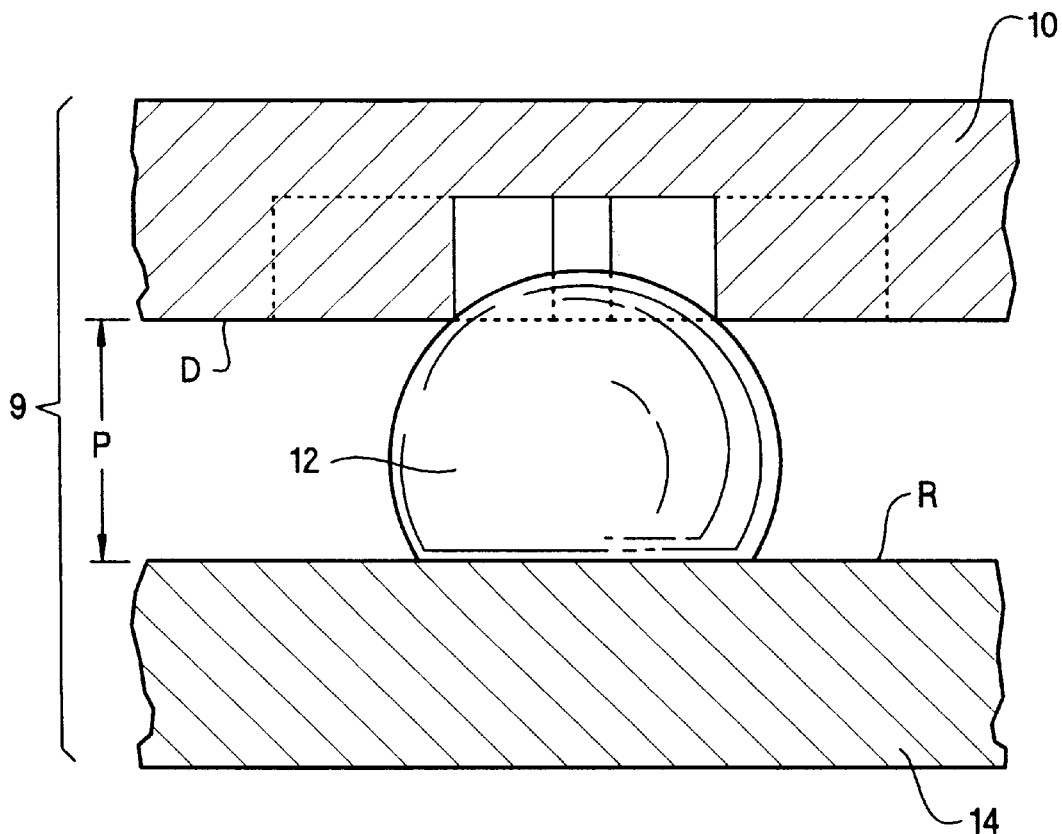
FIG. 1 schematically represents a cross-section of a contained paste deposition assembly.

The drawings described hereinbelow set forth examples of the principles of the present invention. As far as possible, to aid in clear expression of the invention, numbers denoting compositional elements depicted in the drawings are consistent from one drawing to the next.

FIG. 1 schematically represents a cross-section of a contained paste deposition assembly 9 including a donor substrate 10 and a receiving substrate 14. The contained paste deposition bump formation or donor substrate 10 has a surface bearing solder bumps 12, such donor substrate 10 surface D is alignably placed in close proximity to a receiving substrate 14, said receiving substrate having a receiving surface R. Said receiving surface R further having wettable regions to receive solder bumps transferred from the donor substrate 10 by virtue of the alignable placement of the donor surface D and receiving surface R of the respective donor 10 and receiving 14 substrates. The assembly 9 may include spacers interposed between the donor substrate 10 and receiving substrate 14, said spacers may encourage close proximity P while discouraging surface contact that could damage the surface of the receiving substrate.

Figure 2:
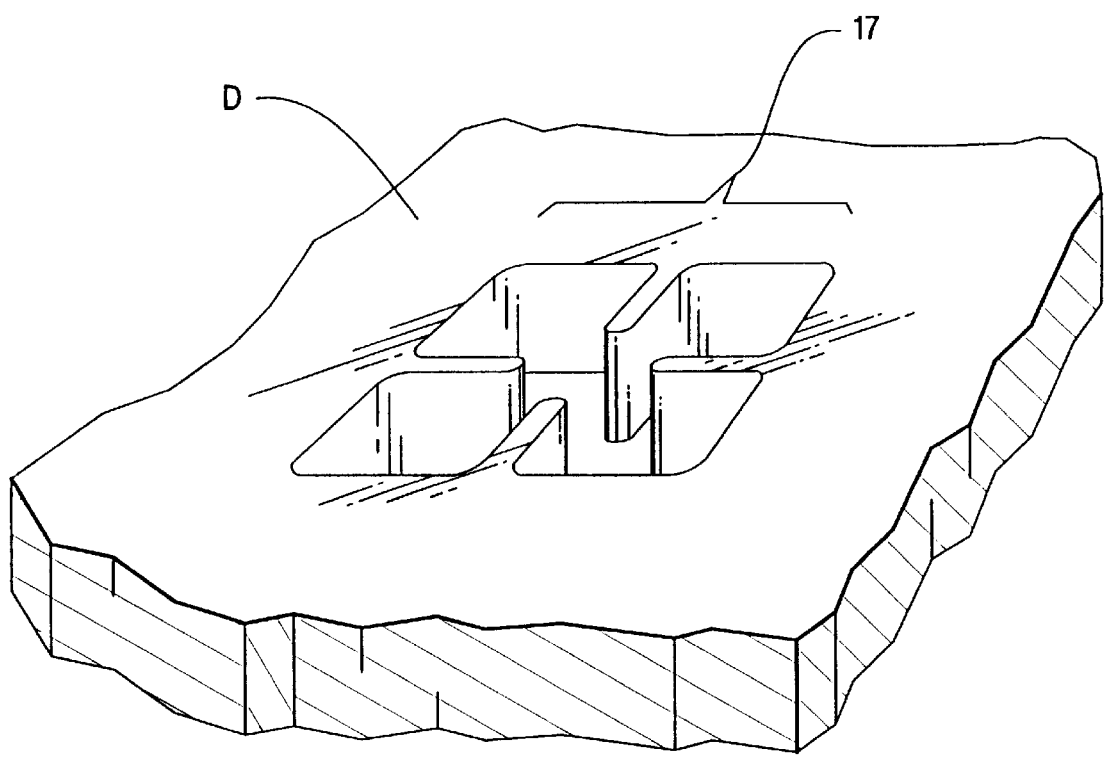
FIG. 2 depicts a portion of a donor substrate bearing a solder containment region or cavity according to the invention taught herein.

FIG. 2 depicts a portion of a donor substrate 10 bearing an improved solder containment region, referred to, herein as a cavity or bump formation region, 17 according to the invention taught herein. The present invention provides for an improved contained paste deposition apparatus, said improvement including the provision of a donor substrate 10 bearing a solder containment cavity 17 wherein the geometric characteristics of the containment region, including the cavity, operate to urge the molten solder bump to protrude from the containment cavity and above the surface of the donor substrate.

Figure 3A:
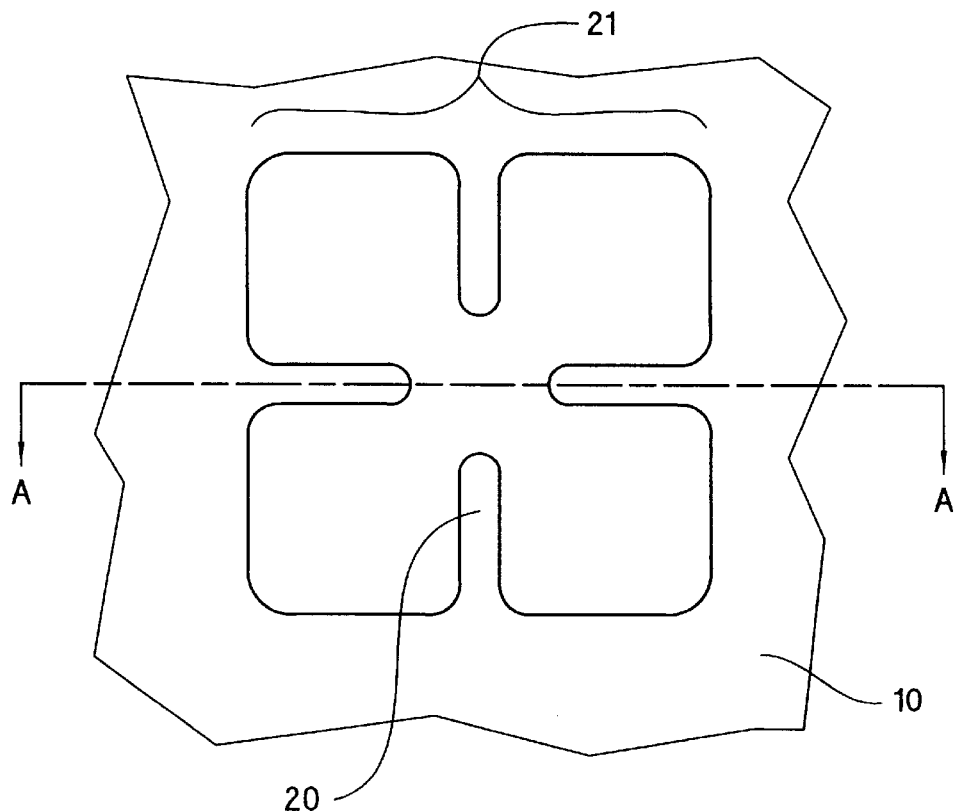
Figure 3B:
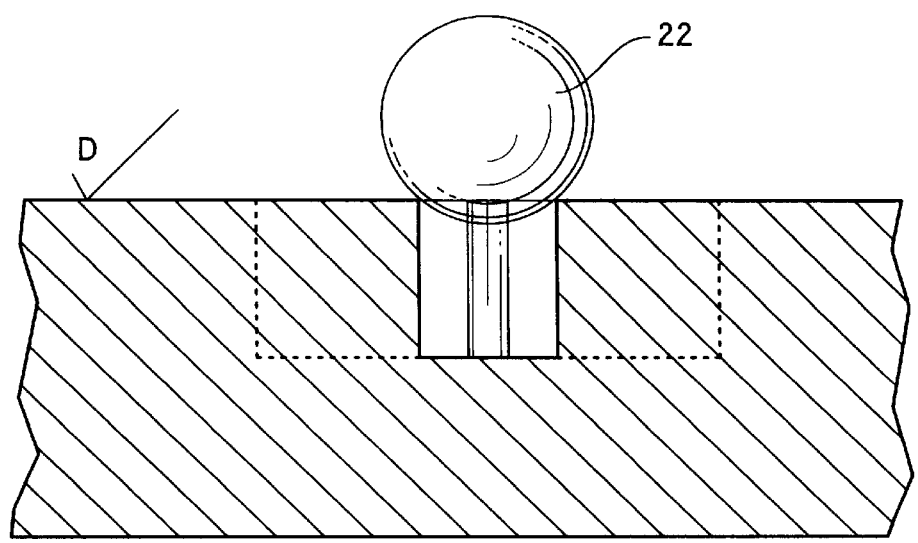

FIGS. 3, 3A and 3B inclusive, illustrates a portion of a donor substrate 10 featuring a solder paste containment region or cavity having a predetermined shape 21. A representative cross section along axis AA of FIG. 3A is depicted in FIG. 3B. FIG. 3B illustrates the shape of the containment cavity 21 and a solder bump 22 formed within said cavity in accordance with the invention taught herein. As may be seen by referring to FIG. 3A, the solder paste containment region or cavity 21 describes a fractal-like shape with two or more stub walls 20 jutting in from the perimeter of the containment cavity. Such shaping and features afford additional volume for solder paste and resultant solder bumps, while urging the reflowed solder bump to protrude a substantial distance above the plane of the donor substrate D. Furthermore, any molten solder bump in a donor substrate 10 according to the present invention remains substantially centered in the containment cavity ensuring that it remains aligned in the appropriate position for consistent transfer.

Figures 4A, 4B:
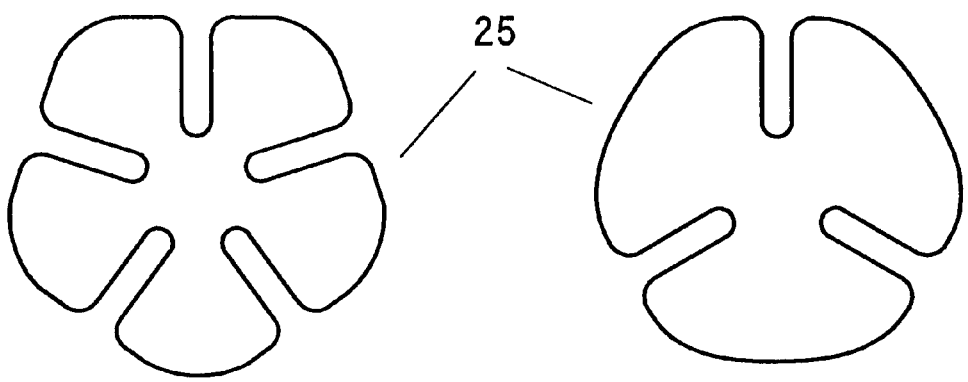
Figures 4C, 4D:
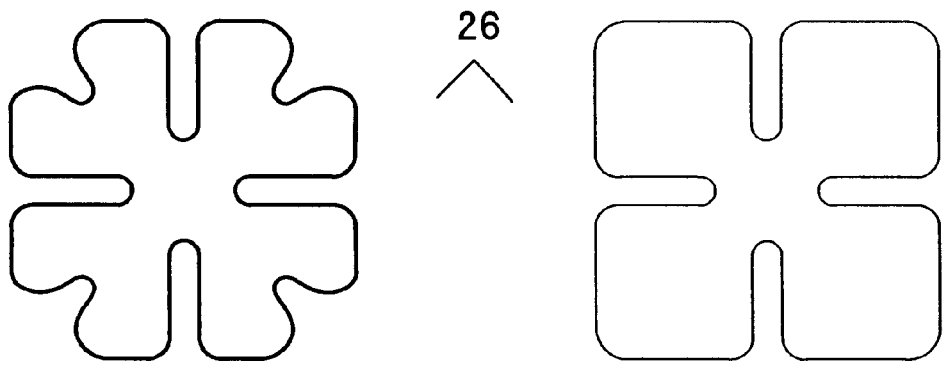
Figure 4E:
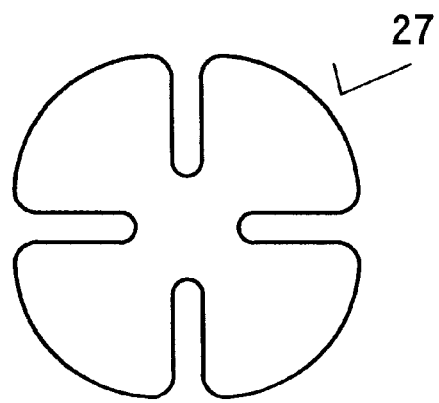

Donor substrate 10 containment region or cavity 17, 21 characteristics are selected to maximize protrusion of the solder bump above the surface of the donor substrate. In order to provide adequate solder volume, the area of the cavity (as depicted, viewed from a point of view perpendicular to the surface D) was maximized, an operative constraint being each cavity would be tiled up against its nearest neighbors. "Tiling" refers to assembling a repeated two dimensional geometry composed of a single shape and a single size, adjacently, so that a predetermined area is completely covered. Only triangles, hexagons and squares tile in two dimensions. Hexagons provide the maximum containment cavity area for staggered array tiling, while square cavities provide maximum cavity area for regular array tiling. In general, triangular cavities are not practical because the pitch distance between their centroids varies. Because the volume of the solder bump is only about half the volume of the solder containment region or cavity, the solder bump diameter is considerably less than the dimensions across the flats of the containment region. For the purposes contemplated for the invention, the preferred embodiment is square with three or more stub walls (See FIGS. 4 A and B).

Each solder bump must be substantially centered in its respective containment region or cavity to ensure alignment with the solderable metallization on the receiving substrate. By dividing the containment cavity into sub-cavities with stub walls extending from the perimeter in toward the center of the cavity (See FIGS. 3A 20; 4A 20), centering of the solder bump is encouraged. Typically, at least three stub walls are useful in providing centering for the solder bump. In some cases, it may prove useful to use both sub-cavities and sub-sub-cavities stub walls to urge the solder paste out of the sub-cavities to protrude in a centered fashion. There are some instances where a pair of stub walls may prove useful. However, three stub walls is the preferred embodiment. Moreover, the preferred embodiment includes an outer dimension, that is a dimension or distance across the flat, of the containment region of within the range of about 200–250 $\mu$m, although the general functional range for typical applications may suggest dimensions of from about 25 $\mu$m to 2.5 mm arcoss flats.

FIGS. 4, 4A through 4E inclusive, illustrates alternate embodiments of the invention taught herein. More particularly, 4A and 4B illustrate hexagonal solder containment deposition regions or cavities 25 useful in staggered array tiling. 4C and 4D illustrate square solder deposition regions 26 for regular array tiling. 4E illustrates a round solder containment region 27. In any or all of the embodiments, the addition of filleted internal corners and rounded external corners provide enhanced mechanical strength and facilitate cleaning of the donor substrate which may be reusable. The donor and receiving substrates may have substantially matching coefficients of thermal expansion and thereby maintain good alignment during reflow. It is also possible to use the same material for both the donor and receiving substrates. Suitable materials for donor substrate include silicon wafer, metal plate, including aluminum, or ceramic, sapphire or glass. Depending on the donor material, the containment regions may be formed by reactive ion etching, conventional milling or electrical discharge machining.

Figure 5A:
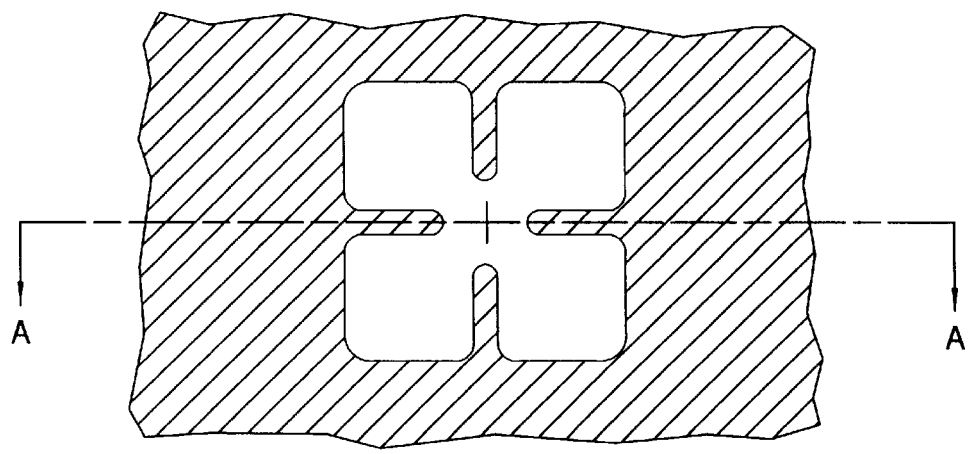
Figure 5B:
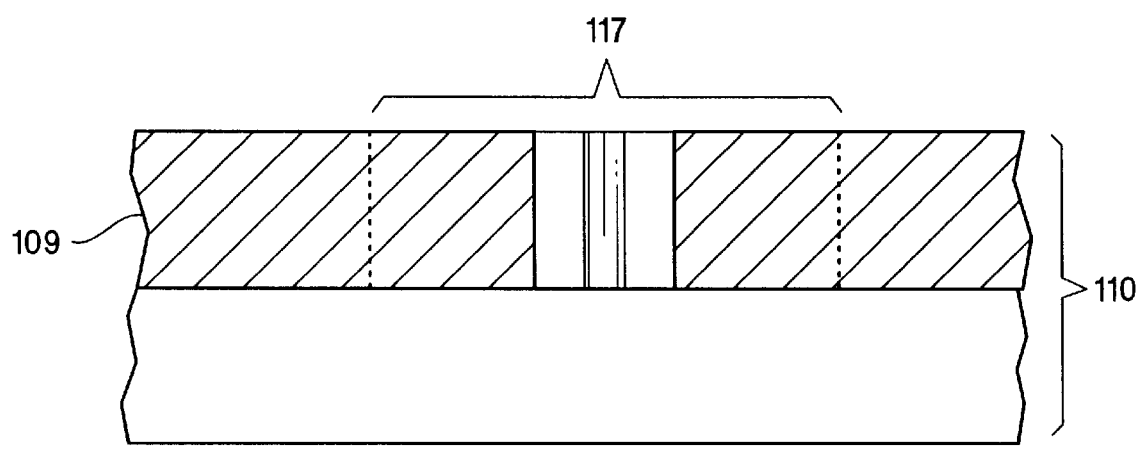

Illustrated in FIG. 5 is an alternate embodiment of the invention taught herein. The donor substrate 110 is a laminate structure of a polymer film, such as, for example, polyimide, over a rigid backer 109, with a solder paste containment region 117 formed in the polymer film by photolithography or laser ablation or some similar manner.

Additional configurations of the improvement taught herein, including but not limited to variations of the solder containment region in the donor substrate, will be apparent to those of average skill in the art and all embodiments incorporating the principles set forth herein are intended to be encompassed in the claims set forth below.

What is claimed is:

1. An improved contained paste deposition apparatus, said apparatus including a donor substrate, a receiving substrate and solder bumps formed from paste during reflow with the donor substrate remaining in place during reflow and solder bumps transferring from the donor substrate to the receiving substrate, said improvement comprising:

solder paste containment regions on the donor substrate, said containment regions having the geometric shape of a fractal to a predetermined depth which determines the volume of the formed solder bumps, each said region operable during reflow to position a molten solder bump such that the molten solder bump protrudes from the surface of the donor substrate thereby facilitating transfer from the donor substrate to the receiving substrate.

2. An improved contained paste deposition apparatus useful in the formation of solder bumps as in claim 1, said improvement further comprising:

solder paste containment region having one or more stub walls around the perimeter of the regions operable to encourage a molten solder bump to a predetermined position.

3. An improved contained paste deposition apparatus useful in the formation of solder bumps as in claim 1, said improvement further comprising:

a paste containment region having a perimeter which maximizes the cavity volume when tiled into a regular array.

4. An improved contained paste deposition apparatus useful in the formation of solder bumps as in claim 1, said improvement further comprising:

a paste containment region having a perimeter which maximizes the cavity wall when tiled onto a staggered array.

5. An improved contained paste deposition containment apparatus useful in the formation of solder bumps as in claim 1, said improvement further comprising:

filleted internal corners and rounded external corners operable to enhance mechanical strength and to facilitate cleaning.

6. An improved contained paste deposition containment apparatus useful in the formation of solder bumps as in claim 1:

where the outer dimensions of the paste containment region are from about 25 $\mu$m to 2.5 mm.

7. An improved contained paste deposition containment apparatus useful in the formation of solder bumps as in claim 1:

where the donor substrate is a material with a non-solder-wettable surface and a coefficient of thermal expansion that substantially matches the coefficient of thermal expansion of the receiving substrate.

8. An improved contained paste deposition containment apparatus useful in the formation of solder bumps as in claim 1:

where the donor substrate is the same material as the receiving substrate.

9. A donor substrate as in claim 8:

where the donor substrate is a silicon wafer with solder paste containment cavities etched into the surface with a reactive ion etching process.

10. A donor substrate as in claim 8:

where the donor substrate is a ceramic, sapphire or glass substrate with solder paste containment cavities etched into the surface with a reactive ion etching process.

11. A donor substrate as in claim 8:

where the donor substrate is a metal plate, with solder paste containment cavities machined into the surface with conventional milling or electrical discharge machining.

12. A donor substrate as in claim 11:

where the substrate material is substantially aluminum.

13. A donor substrate as in claim 8:

where the donor substrate is a laminate structure of a polymer film over a rigid backer, with solder paste containment cavities etched into the polymer film with photolithographic processing or laser ablation.

14. A donor substrate as in claim 13:

where the polymer film is polyimide.

* * * * *